United States Patent [19]

Wedertz et al.

[11] 4,412,272

[45] Oct. 25, 1983

[54] FLEXIBLE PRINTED CIRCUIT CARD ASSEMBLY

[75] Inventors: Larry D. Wedertz, Mira Loma; Oakley G. Ross, Upland, both of Calif.

[73] Assignee: General Dynamics, Pomona Division, Pomona, Calif.

[21] Appl. No.: 297,548

[22] Filed: Aug. 31, 1981

[51] Int. Cl.³ .............................................. H05K 7/20
[52] U.S. Cl. .................................... 361/383; 361/398; 174/52 R; 339/17 F
[58] Field of Search .................... 339/17 F; 174/52 R; 361/380, 381, 382, 383, 386, 414, 395, 399, 398

[56] References Cited

U.S. PATENT DOCUMENTS

| | | | |
|---|---|---|---|
| 2,647,224 | 7/1953 | Bruck | 361/398 |
| 2,682,018 | 6/1954 | Phillips | 361/398 |
| 2,703,853 | 3/1955 | Chrystie | 361/398 |
| 3,164,749 | 1/1965 | Berge et al. | 317/101 |
| 3,389,195 | 6/1968 | Gianakos | 264/45 |
| 3,469,953 | 9/1969 | St. Clair et al. | 29/193.5 |
| 3,553,532 | 1/1971 | Cheshire | 361/386 |
| 3,774,140 | 11/1973 | Reimer | 339/17 C |
| 4,075,420 | 2/1978 | Walton | 174/117 F |
| 4,173,035 | 10/1979 | Hoyt | 339/17 F |
| 4,197,586 | 4/1980 | Nidiffer | 364/708 |
| 4,251,852 | 2/1981 | Ecker et al. | 361/386 |

*Primary Examiner*—G. P. Tollin
*Attorney, Agent, or Firm*—Neil F. Martin; Freling E. Baker; Edward B. Johnson

[57] ABSTRACT

A flexible printed circuit card assembly includes an insulating sheet positioned over the foil of a flexible printed circuit card and adapted to accommodate the passage of electronic component leads therethrough for soldering to the printed circuit card. A layer of protective insulating foam, having a backing thereon, is positioned over the components and the assembly is rolled into a spiral configuration with leads extending from at least one end.

14 Claims, 8 Drawing Figures

FLEXIBLE PRINTED CIRCUIT CARD ASSEMBLY

The present invention relates to a foldable printed circuit card assembly which is rolled into a spiral to provide a compact circuit card configuration.

BACKGROUND OF THE INVENTION

Due to the amount of electronic equipment which must be packaged into airborne devices such as missiles and projectiles, it is necessary to reduce the volume and weight of such circuit components as much as possible. The circuit card area which can be packed with circular, flat cards is 1.2 times the area which can be packed with rectilinear, flat cards. The circuit card area which can be packed with a spirally rolled flexible circuit card is 1.8 times the area which can be packed with a rectilinear, flat card.

Rectilinear cards which are stacked in parallel arrangement normally need a mother board at the end for interconnection. Circular printed circuit cards stacked in parallel arrangement often encounter interconnect and cross talk problems.

Thus, the spirally wound configuration is very desirable. However, the spirally rolled card must have good electrical connection; be able to dissipate heat from the electronic components; and be able to withstand substantial shock.

A spirally rolled card has been proposed in U.S. Pat. No. 2,702,853. This construction utilizes external fasteners connected to the circuit card which create additional weight. Also, this construction cannot be processed through the usual wave solder both used in electronic assembly so the cost is high. U.S. Pat. No. 2,647,224 discloses a folded circuit strip which provides complicated fold over loop sections for retaining components in position and utilizes hard wire connections which add to the weight of the device.

SUMMARY OF THE INVENTION

Therefore, it is an object of the present invention to provide a new and improved flexible printed circuit card assembly for mounting electronic components that is rolled into a spiral and that provides high reliability in a low weight, low volume configuration.

It is another object of the present invention to provide such a new and improved flexible printed circuit card assembly which lends itself to low cost assembly, inspection and testing.

It is a further object of the present invention to provide such a new and improved flexible printed circuit card assembly which provides efficient cooling and protection of the components.

These and other objects of the invention are accomplished by a flexible printed circuit card assembly that includes a sheet of insulating material positioned on the conductive circuit paths. Electronic components are mounted on the card with their leads extending through the sheet and soldered to the foil on said card. A cushioning and insulating layer is placed upon the components. This assembly is then spirally rolled into a cylindrical configuration to provide a compact, reliable assembly.

DETAILED DESCRIPTION OF THE DRAWINGS

DETAILED DESCRIPTION OF THE INVENTION

Figure 1:
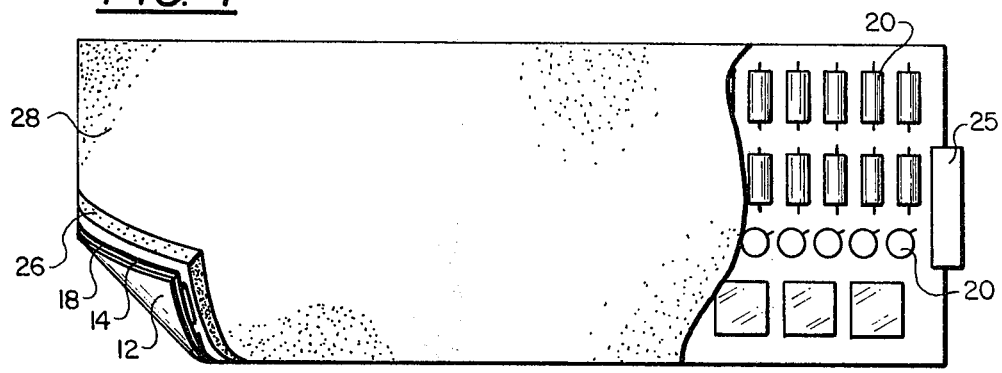
FIG. 1 is a plan view of a flexible printed circuit card assembly embodying the present invention with a portion of the insulating sheet broken away and with a portion rolled up to show details of construction.
Figures 2, 3, 4:
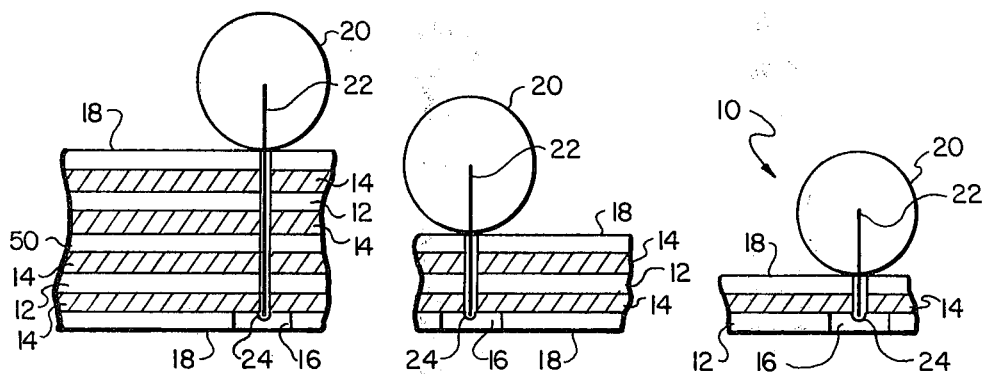
FIG. 2 is a partial enlarged view of an electronic component attached to the printed circuit board before the insulating sheet is positioned over the component.
FIG. 3 is a view similar to FIG. 2 showing a double sided printed circuit board.
FIG. 4 is a view similar to FIG. 2 showing two double sided printed circuit boards connected in the center by a bondply.
Figure 6:
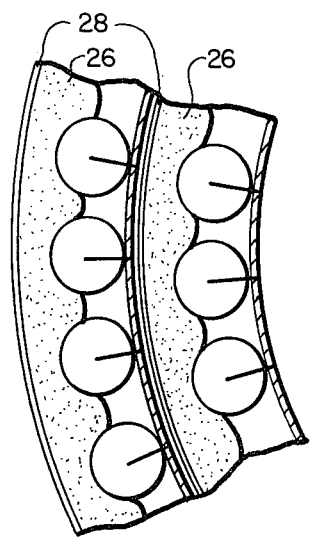
FIG. 6 is a partial view of the printed circuit card assembly of the present invention in the rolled configuration.

A printed circuit card assembly is shown at 10 in FIGS. 1 and 2 of the drawings and includes a flexible base or card 12 of insulating material. A copper clad circuit path 14 is provided on the card 12 and the card 12 includes openings 16 through which solder can flow. A sheet of flexible, electrical insulating material 18 is positioned over the circuit path 14. Several electronic components 20 are positioned on top of the insulating sheet and connected to the printed circuit as shown in FIG. 1. FIG. 2 shows one such component resistor 20, positioned in place with its leads 22 extending through the sheet 18 and circuit path 14 and extending into opening 16 in card 12 where solder is applied at 24 by solder means such as wave solder bath.

Figure 5:
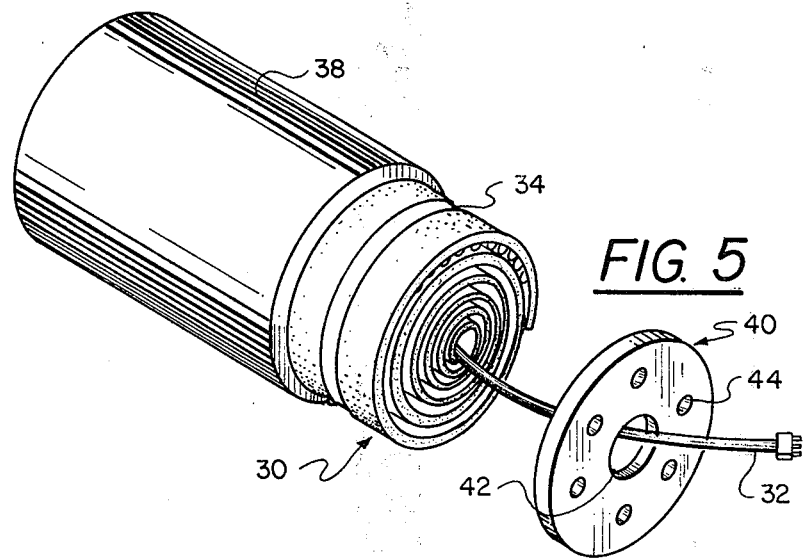
FIG. 5 is a perspective view of the flexible printed card of the present invention rolled into a spiral and partially inserted into a container with leads extending through a lid for the container.

FIG. 1 shows the circuit card assembly with various components soldered in place on the printed circuit card. A connector is shown at 25 for making external connections to the printed circuit card. A sheet 26 of light weight insulating plastic foam having a backing 28 of material such as Mylar is laid over the components and the assembly is rolled into a spiral to form a generally cynlindrical shaped package 30 as shown in FIG. 5. Leads 32 from the printed circuit card are taken out end of the cylinder. The wrapped printed circuit card is held in the cylindrical configuration by suitable means such as plastic straps 34.

Figure 7:
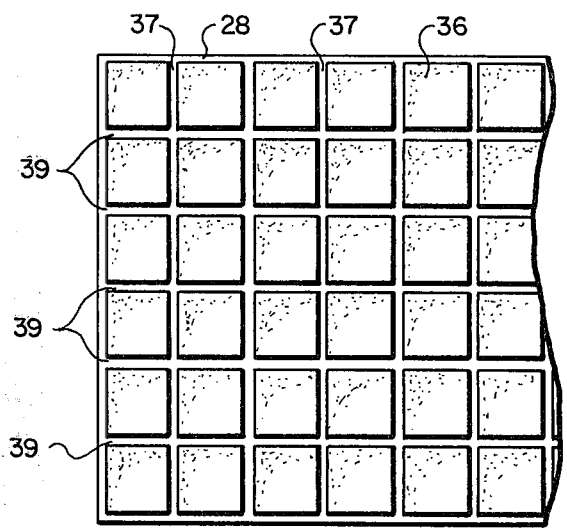
FIG. 7 is a partial plan view of the cushioning and insulating layer showing a waffled configuration having air paths separating the cushion sections.
Figure 8:
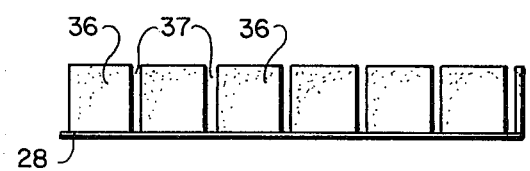
FIG. 8 is a side elevation of the embodiment shown in FIG. 7.

The plastic foam cushions the components and the Mylar backing prevents crushing of the components when they are positioned within the spiral configuration. An alternate form of plastic cushion is shown in FIGS. 7 and 8 of the drawings. The plastic foam is provided on the Mylar backing sheet 28 in sections 36 secured to the backing sheet by an adhesive. The sections are separated by paths 37 and 39 which provide increased air circulation for cooling high temperature electronic components. This type of waffled construction can be used over the entire Mylar backing sheet or it can be used just near the high temperature electronic components if desired. Also those electronic components which generate the most heat can be laid out on the printed circuit card so that they are closest to the ends of the cylinder.

The cylindrical printed circuit card assembly can be inserted into a container 38 (FIG. 5) of substantially rigid plastic material to protect the assembly. A plastic cap 40 is placed over the end of the container and the leads 32 are passed through the opening 42 in the cap. The cap also includes openings 44 to provide air circulation. The opposite end of the cylinder 38 may include a cap such as cap 40.

FIG. 3 demonstrates a double sided printed circuit wherein the card 12 includes conductive paths 14 and cover layers 18 on both surfaces wherein components can be positioned on both sides of the card.

FIG. 4 shows a multi-layer construction wherein two double sided cards are connected together by a bond ply of insulating material 50 to which the cards are affixed by suitable means such as an adhesive. The multi-layer configuration permits the crossing of conductive paths in the layers of circuitry of conductive material without electrical interference.

The construction of the present invention provides easy access to the components on the printed circuit card, and they can be readily tested.

Having thus described our invention, we claim:

1. A flexible printed circuit card assembly comprising:
   a strip of flexible insulating material having printed circuit conductor means thereon for accepting the leads of electronic components and embodying them into said circuit;
   a sheet of insulating material positioned on said conductor means for covering said conductor means, said sheet having openings for accommodating the leads of electronic components extending into said printed circuit conductor means; and
   a cushioning layer of foam insulating and cushioning material having a plurality of air channels therein positioned on said sheet for covering electronic components when mounted on said sheet and connected to the printed circuit conductor means for electrically insulating and cushioning said components when said card is folded into a spiral.

2. A flexible printed circuit card assembly according to claim 1 wherein the cushioning layer of foam material is on a resilient backing sheet that is sufficiently stiff to reduce flexing.

3. A flexible printed circuit card assembly according to claim 1 and including means for retaining said printed circuit card assembly in a rolled, cylinder configuration.

4. A flexible printed circuit card assembly comprising:
   a strip of flexible insulating material having printed circuit conductor means thereon for accepting the leads of electronic components and embodying them into said circuit;
   a sheet of insulating material positioned on said conductor means for covering said conductor means, said sheet having openings for accommodating the leads of electronic components extending into said printed circuit conductor means; and
   a cushioning layer of insulating and cushioning material at least a portion of said cushioning layer includes separate blocks of foam material separated by air channels therebetween on a resilient backing sheet that is sufficiently stiff to reduce flexing, positioned on said sheet for covering electronic components when mounted on said sheet and connected to the printed circuit conductor means for electrically insulating and cushioning said components when said card is folded into a spiral.

5. A flexible printed circuit card assembly comprising;
   a strip of flexible insulating material having printed circuit conductor means therein;
   a sheet of insulating material positioned on said conductor means for covering said conductor means and having lead-accommodating openings therein;
   a plurality of electronic components positioned on said sheet of insulating material with their leads extending through the openings in said insulating material and soldered to said conductor means;
   a layer of foam insulating and cushioning material having a plurality of air channels therein positioned on top of said electronic components for electrically insulating and cushioning said components;
   said assembly being rolled as a spiral into a cylindrical configuration; and
   connection means for electrically connecting said printed circuit card assembly to means outside said assembly.

6. A flexible printed circuit card assembly according to claim 5 wherein the cushioning layer of foam material is on a resilient backing sheet that is sufficiently stiff to reduce flexing.

7. A flexible printed circuit card assembly according to claim 5 including means for retaining said printed circuit card assembly in a rolled, cylindrical configuration.

8. A flexible printed circuit card assembly according to claim 6 wherein said cylindrical assembly is positioned inside a hollow cylindrical container; and a lid is provided for positioning on the end of said cylinder, said lid having openings therein to permit air circulation within said container.

9. A flexible printed circuit card assembly according to claim 8 wherein said lid includes an opening for passing through connection leads from said printed circuit card assembly to the outside of said container.

10. A flexible printed circuit card assembly comprising:
    a strip of flexible insulating material having printed circuit conductor means therein;
    a sheet of insulating material positioned on said conductor means for covering said conductor means and having lead-accommodating openings therein;
    a plurality of electronic components positioned on said sheet of insulating material with their leads extending through the openings in said insulating material and soldered to said conductor means;
    a layer of insulating and cushioning material at least a portion of said cushioning layer includes separate blocks of foam material on said backing sheet separated by air channels therebetween on a resilient backing sheet that is sufficiently stiff to reduce flexing positioned on top of said electronic components for electrically insulating and cushioning said components;
    said assembly being rolled as a spiral into a cylindrical configuration; and
    connection means for electrically connecting said printed circuit card assembly to means outside said assembly.

11. A flexible printed circuit card assembly according to claim 4 and including means for retaining said printed circuit card assembly in its rolled, cylinder configuration.

12. A flexible printed circuit card assembly according to claim 10 including means for retaining said printed circuit card assembly in its rolled, cylindrical configuration.

13. A flexible printed circuit card assembly according to claim 12 wherein said cylindrical assembly is positioned inside a hollow cylindrical container; and a lids is provided for positioning on the end of said cylinder, said lid having openings therein to permit air circulation within said container.

14. A flexible printed circuit card assembly according to claim 13 wherein said lid includes an opening for passing through connection leads from said printed circuit card assembly to the outside of said container.

* * * * *